United States Patent [19]

Toshiyuki

[11] Patent Number: 4,929,886
[45] Date of Patent: May 29, 1990

[54] APPARATUS FOR DETECTING NOISE IN THE MEASUREMENT OF VERY SMALL RESISTANCE

[75] Inventor: Nakaie Toshiyuki, Wakayama, Japan

[73] Assignee: Hanwa Electronic Co., Ltd., Wakayama, Japan

[21] Appl. No.: 386,364

[22] Filed: Jul. 26, 1989

[51] Int. Cl.$^5$ ............................................. G01R 27/00
[52] U.S. Cl. ..................................... 324/691; 324/133; 340/661
[58] Field of Search ...................... 324/62, 60 CD, 133, 324/57 N; 340/661; 307/360, 362, 354; 361/90

[56] References Cited

U.S. PATENT DOCUMENTS

| | | | |
|---|---|---|---|
| 3,947,760 | 3/1976 | Noguchi et al. | 324/60 CD |
| 4,068,165 | 1/1978 | Labinsky et al. | 324/62 |
| 4,743,836 | 5/1988 | Grzybowski et al. | 324/60 CD |
| 4,761,639 | 8/1988 | Pyke et al. | 340/661 X |

Primary Examiner—Reinhard J. Eisenzopf
Assistant Examiner—Jack B. Harvey
Attorney, Agent, or Firm—Burgess, Ryan and Wayne

[57] ABSTRACT

A pair of a first and a second R-C integrating circuits connected in series. A first switch $S_1$ supplies a first combined voltage $E_1+E_3$ of a first positive threshold voltage $E_1$ and a positive initial set up voltage $E_3$ to a first capacitor in the first R-C circuit, and a second switch $S_2$ supplies a second capacitor with a second combined voltage of a second positive threshold voltage $E_2$ with a negative initial set up voltage $-E_4$. The switches $S_1$ and $S_2$ are closed before the input of the signal to be measured. The switches are opened after the input of the signal. A first comparator compares a first discharged voltage output from the first capacitor and the first threshold voltage $E_1$, and a second comparator compares a second discharged voltage output from the second capacitor and the second threshold voltage $E_2$. A logic circuit is connected to the output terminals of the first and second comparators, respectively, and determine in conjunction with a timing circuit whether the first and second discharged voltages are within a range between the first threshold voltage $E_1$ and second threshold voltage $E_2$ within a predetermined time period of the input of the signal to be measured, so as to provide an indication to judge the right time for resistance measurements.

2 Claims, 4 Drawing Sheets

APPARATUS FOR DETECTING NOISE IN THE MEASUREMENT OF VERY SMALL RESISTANCE

BACKGROUND OF THE INVENTION

1. Field of the Invention

The present invention relates to an ohmmeter of the type capable of measuring small electric resistance in units of milliohms.

2. Description of the Prior Art

Electrical resistance is the rate of the potential difference between the ends of a conductor to be measured to the electrical current flowing in the conductor. With respect to FIG. 1, which is a diagram of a model circuit showing the relationship of electrical current I with the voltage difference V across a resistor $R_x$ is expressed by the formula:

$$R = V/I \qquad (1)$$

In the diagram, e is an alternating current source generating a current of known value I, $V_o$ is a voltmeter giving readings of voltage difference V, and $R_x$ is a resistor or conductor supposed to have a resistance R to be measured.

With the progress of precise electrical applications, it has become increasingly necessary to determine very small magnitudes of resistance.

Measurements of resistance in minute units naturally involves dealing with correspondingly smaller denominations of amperage and voltage. Measurements of infinitesimal magnitudes have normally involved using attenuators and amplifiers with high and stable gains, such as operational amplifiers.

However, these conventional methods have been found to pose problems. The operational amplifiers have generated noises having serious effects on the readings.

Some attempts have been made to eliminate the above drawback. For example, as in most cases, a noise filter has been connected to the amplifier. However, the use of noise filters have failed to help much.

Assuming that an ideal measuring instrument is used to determine the voltage difference V across a conductor with a resistance of I microhm when an alternating current at 1 milliampere is applied to the conductor, the theoretical voltage difference V should be 1 nanovolt, or $1 \times 10^{-9} = 1 \times 10^{-6} \times 1 \times 10^{-3}$, according to the equation $V = RI$ obtained by adjusting the equation 1 above for V. However, in actual practice, the generation of noises must be considered. Using statistical mechanics, which looks into the mechanical properties of large assemblies of particles or components in terms of statistics, noise Vn in volts for voltage difference nV to be measured is given by the formula:

$$V_n = 2\sqrt{kTR\Delta f} \, nV \qquad (2)$$

where K is Boltzmann's constant, T is absolute temperature, R is conductor resistance and $\Delta f$ is the noise range of the instrument used for measuring voltage differences.

Even when one of those most advanced operational amplifier producing the least noises is used, for a very small voltage difference of $1 \times 10^{-9}$, the amplifier would develop a noise level of about $1.2\sqrt{\Delta f} nV$, a level almost approaching the difference to be measured, using the equation 2 above, where $2\sqrt{kTR}$ is known to be $1.2 \times 10^{-9}$. If the noises generated are that high, accurate measurements of resistances through amplification of voltage differences would almost be impossible, particularly when magnitudes involved are very small.

Various improvements have been proposed to eliminate the above difficulty. For example, a phase detection circuit 8, as illustrated in schematic form in FIG. 2, may be used. The phase detection circuit 8 comprises an inverter circuit 10 and a R-C circuit 12.

With respect to FIG. 2, when a voltage difference Vo to be measured is applied to the detection circuit 8 at its input terminal 8a, the inverter circuit 10 splits each cycle of the input signal Vo into a first and a second half wave. The first halves of positive polarity of the signal Vo appear, as they are, on a first output terminal 8b of the inverter circuit 10. A combination of a operational Amplifier A and a pair of resistors $R_1$ and $R_2$ inverts the second halves in polarity, and outputs the inverted second half waves through a second output terminal 10c. A switch means S alternates between the first output terminal 10b and second output terminal 10c to integrate the noniverted first halves and inverted second halves into a train of whole wave cycles. In this process, noises are superimposed onto the voltage signal Vo being measured. The R-C circuit 12, which is comprised of a capacitor $C_{12}$ and a resistor $R_{12}$, is connected to the inverter circuit 10 to achieve a reduction in the noise signal superimposed over the voltage signal to be measured. The R-C circuit 12 outputs the result of electric charge storage at its output terminal 12h as a voltage level $e_o$, after noise reduction, which would be a close approximation of the voltage signal Vo to be measured. The process of this reduction will be explained in more detail with reference to the diagrams in FIG. 3.

The diagrams shown in FIG. 3 are the waveform of difference voltage signals, with times taken along the horizontal axis. FIG. 3(a) is the waveform of the voltage difference Essin $\omega t$ to be measured. The waveform of FIG. 1 is superimposed onto the waveform of the noise Ensin $(\alpha t + \theta)$ generated, as shown in FIG. 3(b), to develop a combined waveform Essin $\omega t$ Ensin $(\alpha t + \theta)$, as indicated in FIG. 3(c). In this description, the noise is shown as a sine wave signal for the sake of simplicity of explanation, although noises in actual cases come in far more complicated waveforms. On the output terminal of the inverter circuit 10, a superimposed signal similar to the one in FIG. 3(d) would appear as a result of inversing the second half of each wave cycle in the waveform of FIG. 3(c).

The inversed voltage signal of FIG. 3(d) is expressed as $E_s \sin \omega t + E_n \sin (\alpha t + \theta)$ when $(2n-1)\pi/\omega > t \geq 2(n-1)/\omega$, and $-\{E_s \sin \omega t + E_n \sin (\alpha t + \theta)\}$ when $2n\pi/\omega > t > 2(n-1)\pi/\omega$, where n: integer, $\omega$: frequency, $\alpha$: frequency of noise voltage, $\theta$: phase of noise voltage.

Since the signal shown in FIG. 3(d) is inversed at time intervals $\pi/\omega$, that part of it which constitutes the voltage signal Vo to be measured is expressed as Essin $\omega t$ in absolute value.

However, although the part of the inversed FIG. 3(d) signal that constututes the noise voltage, which is also inversed at time intervals of $\pi/\omega$, its time average would come almost zero since such noise can normally occur in wide ranges of amplitude and frequency.

In normal condition, the time average of the output voltage signal $e_o$ from the inverter circuit 10 of FIG. 2 is expressed as $2/\pi \cdot E_s$.

It might be important to note here that, instead of inverting the voltage signal Vo to be measured in the manner as described above, full-wave rectification of the superimposed voltage of FIG. 3(c) to obtain a waveform as shown in FIG. 3(e) would mean irrelevance. Such full-wave rectification would produce an average of Essin $\omega t$+Ensin $(\alpha t+\theta)$ in absolute value, including the noise signal component Essin $(\alpha t+\theta)$ The phase detection circuit 8 shown in FIG. 2 yields an average of the inversed voltage signal of FIG. 3(d) through the function of the capacitor $C_{12}$.

The voltage signal that appears on the output terminal of the capacitor $C_{12}$ comes Essin $\omega t$, an absolute value, since the noise component is reduced to zero through integration by the capacitor.

Letting the voltage signal $e_i$ input to the phase detection circuit 8 Essin $\omega t$, the voltage signal $e_o$ appearing on the output terminal of the capacitor $C_{12}$ is given by a series of computations as follows:

When the frequency $\omega$ for the signal is $\pi/\omega > t > 0$, $e_o$ is expressed as follows using the Laplace transformation:

$$e_o = Es/(1+\omega^2 C^2 R^2)\{(\sin \omega t - \omega CR \cos \omega t) + \omega CR e^{-t/RC}\} \quad (3)$$

when

C: capacitance value of capacitor, $C_{12}$
R: resistance value of resistor $R_{12}$
e: euler's constant When $2\pi/\omega \geq t \geq \pi/\omega$, $e_o$ is expressed using the theorem of superimposition:

$$e_o = Es/(1+\omega^2 C^2 R^2)\{-(\sin \omega t - \omega CR \cos \omega t) + \omega CR(1+2e^{\pi/\omega CR})e^{-t/RC}\} \quad (4)$$

Generally, in the relation $(n-1)\pi/\omega < t < n\pi/\omega$ to determine the value for n, fthe voltage signal $e_o$ is:
(1) for the value "n" being an odd number, $$e_o = Es/(1+\omega^2 C^2 R^2)\{(\sin \omega t - \omega CR \cos \omega t) + \omega CR(1+2e^{\pi/\omega CR}+2e^{2\pi/\omega CR} \ldots + 2e^{(n-1)\pi/\omega CR})e^{-t/RC}\},$$

and, (2) for the value "n" being an even number, $$e_o = Es/(1+\omega^2 C^2 R^2)\{-(\sin \omega t - \omega CR \cos \omega t) + \omega CR(1+2e^{\pi/\omega CR}+2e^{2\pi/\omega CR} \ldots + 2e^{(n-1)\pi/\omega CR})e^{-t/RC}\},$$

Combining the equations (5) and (6) above gives:

$$e_o = Es/(1+\omega^2 C^2 R^2)[\pm(\sin \omega t - \omega CR \cos \omega t) + \omega CR\{(2e^{n\pi/\omega CR}-2)/(e^{\pi/\omega CR}-1)-1\}e^{-t/RC}] \quad (7)$$

Of the double signs ± in the equation 7 above, the "+" is for the value "n" being an odd numer, and the "−" is for the value "n" being an even number.

In actuality, since voltage signals to be measured normally are designed greater in frequency $\omega$ and time constants R, C, so $\omega RC > 1$.

Thus, the last term in the righthand side of the equation 7 above can be simplified as follows:

$$\{(2e^{n\pi/\omega CR}-2)/(e^{\pi/\omega CR}-1)-1\}e^{-t/RC} = \quad (8)$$

$$\{(2e^{n\pi/\omega CR} - e^{\pi/\omega CR} -1)/(e^{\pi/\omega CR}-1)\} e^{-t/RC} \approx$$

$$2(1-e^{-t/RC})/(e^{\pi/\omega CR}-1)$$

For the equation 8 above, $e^{n\pi/\omega CR - t/RC} \approx 1$, $e^{\pi/\omega CR - t/RC} \approx 1$.

$$e^{\pi/\omega CR} \approx 1 + \pi/\omega CR$$

Putting the value for the above-mentioned term into the equation 7 for the capacitor output voltage signal $e_o$, and further approximation yields:

$$e_o = 2Es/\pi(1-e^{-t/RC}) \quad (9)$$

In the above computation, the value for the first term of the equation 7 is ignored because it is very small compared with the value for the last term.

In other words, the value of the transient voltage signal $e_o$ appearing on the output terminal of the capacitor $C_{12}$ of FIG. 2 is obtained by multiplying the term "$1-e^{-t/RC}$" of the equation 7 with the average value $2Es/\pi$ that is reached by full-wave rectification of the voltage signal input to the phase detection circuit 8.

Accordingly, when the inversed voltage signal ein having value |Essin $\omega t$| appearing on the output terminal of the phase detection circuit 8 in FIG. 2 is applied to the capacitor $C_{12}$, the system would always take a delay of fixed duration before the output terminal of the capacitor produces constant voltage signals whose values are or close $2Es/\pi$. In this case, the noise voltage is ignored since a time average of its value becomes almost zero.

Furthermore, it is well known that the noise to signal ratio (S/N), the ratio of the magnitude of the signal to that of the noise, for the circuit in FIG. 2 is expressed by the following formula:

$$S/N = 2/\tau foEs/EN, \quad (10)$$

where fo: the frequency of the voltage signal being measured, which is equivalent to $\omega/2\pi$ for the aforesaid voltage signal Essin $\omega t$
$\tau = CR$: time constants by $C_{12}$, $R_{12}$ in the circuit of FIG. 2
$E_n$: the amplitude of the noise signal For example, when the voltage signal is input to the phase detection circuit at a frequency of 1 kHz, the amplitude of the noise voltage En that would be produced even by one those most advanced amplifiers with the least noise is as follows using the equation 2 above for noise voltages:

$$E_n = 1.2 \times \sqrt{1,000} \approx 38 \text{ nanovolts.}$$

Normally, the value for fo is 1 kHz. When the value from the equation 9 for S/N ratios is required to be 1, when the above value for fo, along with the aforesaid value for En is put into the equation, the value for $\tau$ must be 0.36 (in seconds). This means that the R-C circuit 12 must be designed such that the combined time constant for the capacitor $C_{12}$ and resistor $R_{12}$ is 0.36.

It thus follows that for an R-C circuit such as shown in FIG. 2 to produce its output voltage within a 99% target accuracy range of the voltage signal Es to be measure, the value for $e^{-t/\tau}$ must be 0.01, based on the relation $Es(1-e^{-t/\tau})=0.99E$.

This means that the operator has to wait about 1.7 seconds before the result of measurement at about 1% error is obtained.

SUMMARY OF THE INVENTION

The present invention has been proposed to eliminate the drawback of the difficulties with the prior art micro ohmmeters using phase detection circuits.

It is therefore a primary object of the present invention to provide a micro ohmmeter capable of fast readings, with the elimination of time delays in measurement.

The present invention proposes an improvement in ohmmeters using a phase detection circuit consists of an inverter circuit to inverse the half wave of each cycle of the voltage difference as a function of resistances to be measured and an R-C circuit to integrate split half waves into a train of whole cycles. The improvement comprises a pair of integrating R-C circuit connected in parallel. A first threshold voltage combined with a first initiatially set up voltage $E_1+E_3$ (wherein $E_1$: first threshold voltage, $E_3$: first set up voltage) is pre-charged into a first capacitor in the first integrating R-C circuit through a first switch means $S_1$ to be discharged when a voltage difference signal to be measured is applied to the system. A first comparator compares the output from the capacitor with the threshold voltage E.

A combined second threshold voltage with a second initilly set up voltage $E_2-E_4$ (wherein $E_2$: second threshold voltage, $-E_4$: second set up voltage) is also pre-charged into a second capacitor in the second integrating R-C circuit through a second switch mians $S_2$, also to be discharged at the application of the voltage signal to be measured. A second comparator compares the output of the capacitor in the second R-C circuit with the second threshold voltage $E_2$. A timing circuit is connected to determine each of the voltage outputs from the first and second capacitors is within the range of their associated threshold voltage $E_1$ and $E_2$ (in the other words between $E_1$ and $E_2$) within a predetermined time period of the application of the voltage signal to be measured.

BRIEF EXPLANATION OF THE ACCOMPANYING DRAWINGS

FIG. 3 shows a group of diagrams showing the waveform of voltage signals in the different stages of resistance measurement in which:

Figure 5:
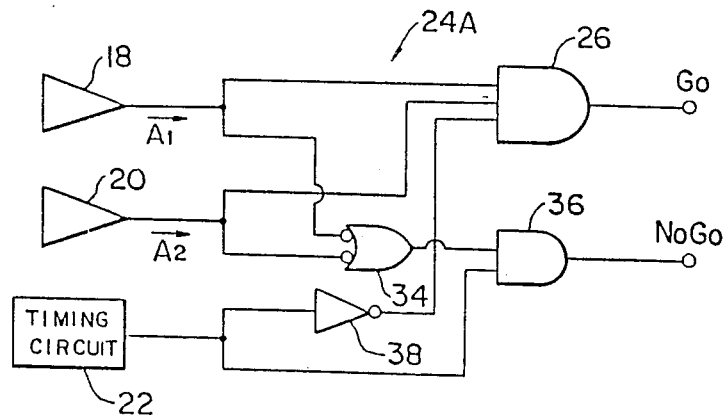
Figure 6A:
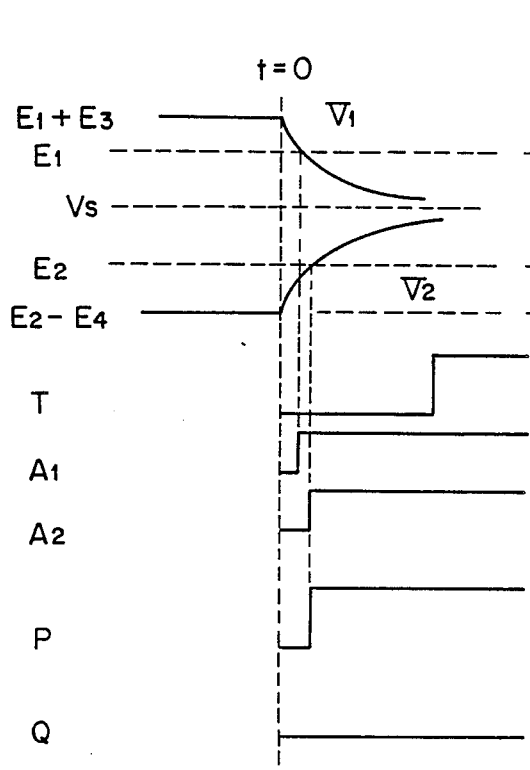
Figure 6B:
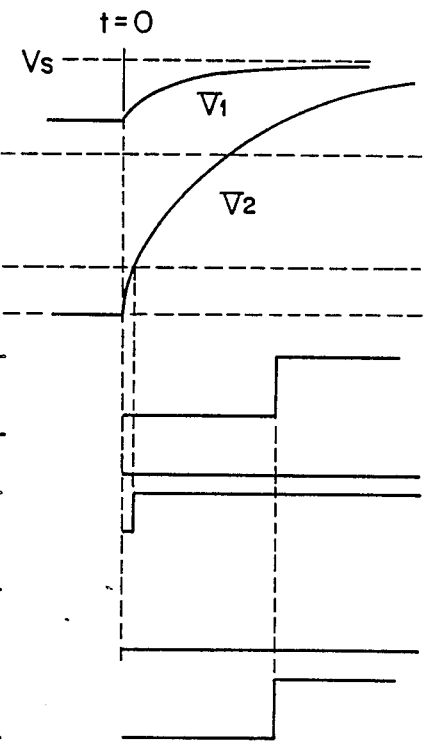

FIG. 5 is a schematic of a logic circuit designed to determine the value for P and Q, where $P=(A_1+A_2)\overline{T}$ and $Q=(\overline{A_1}+\overline{A_2})T$; and FIGS. 6(a) and 6(b) are diagrams indicating the value for $A_1$, $A_2$, T, P and Q when the voltages appearing at the output terminals of the two capacitors in the paired R-C circuit are in the range of their associated threshold voltage and out of the range of their associated threshold voltage, respectively

DETAILED DESCRIPTION OF THE INVENTION

Figure 4:
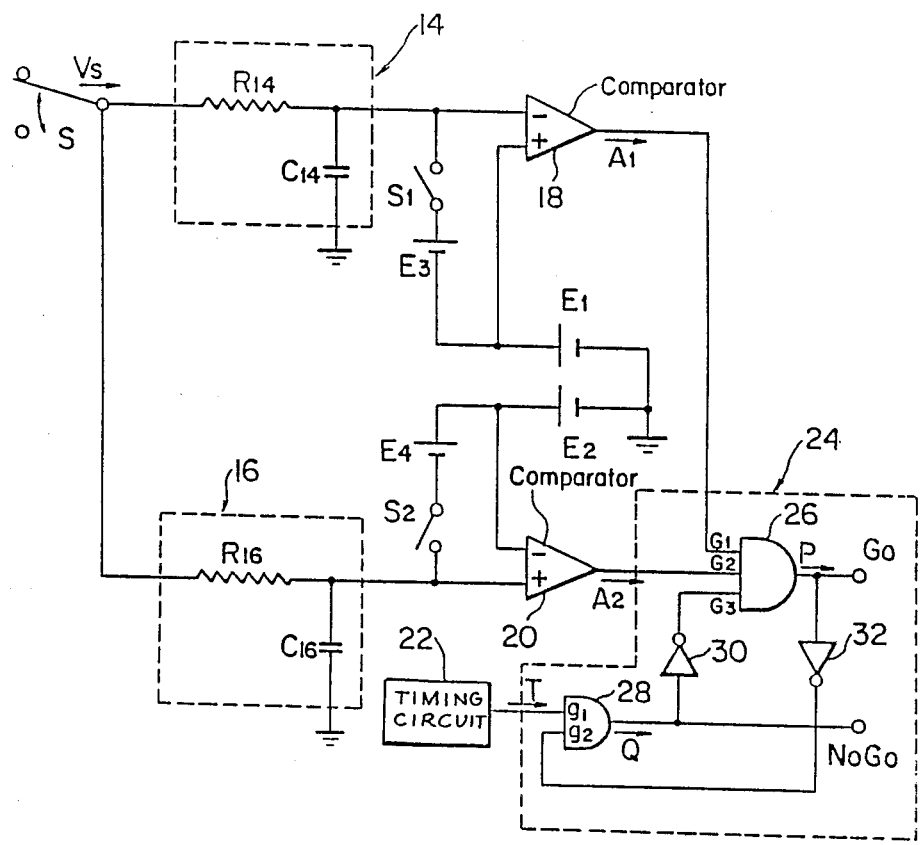
FIG. 4 is a schematic showing a preferred embodiment of the present invention using pairs of integrating circuits and comparators.

Referring first to FIG. 4, which is a schematic representation of a micro ohmmeter according to a preferred embodiment of the present invention, a noise reduction circuitry 12 include a pair of a first R-C integrating circuit 14 and a second R-C integrating circuit 16 connected in parallel. The noise reduction circuitry 12 is connected to a combination of a switch means S and a inverter circuit similar to the switch means S and the circuit 10 described earlier in association with FIG. 2. The inverter circuit may be any known type capable of splitting each cycle of an alternating voltage signal into a non-inverted first half wave and an inverted second half wave, and the switch means combines the split half waves into a train of whole cycles.

The first R-C circuit 14 comprises a first resistor $R_{14}$ and a first capacitor $C_{14}$. Similarly, the second R-C circuit 16 consists of a second resistor $R_{16}$ and a second capacitor $C_{16}$.

The first capacitor $C_{14}$ of the first R-C circuit 14 is supplied through its input stage with electricity by a positive initialization voltage $E_3$ and a first threshold voltage $E_1$, connected in series, through a first switch means $S_1$. The first switch means $S_1$ charges the first capacitor $C_{14}$ with a combined voltage of $E_1$ and $E_3$. Also, a negative initialization voltage $E_4$ and a second threshold voltage $E_2$ are connected in series, and are added to be fed to the second capacitor $C_{16}$ through its input stage in the second R-C circuit through a second switch means $S_2$. As with the first switch means $S_1$, the second switch means $S_2$ charges its capacitor in a timed relationship with the input of the inversed voltage signal $V_o$ to the noise reduction circuit 12, as will later be described.

The first and second threshold voltages $E_1$ and $E_2$ must be set to differ in magnitude than each other so as to define in combination a range for the reason that will be described. In this particular embodiment, the first threshold voltage $E_1$ is greater than the second $E_2$ for the sake of description. However, this assumption should not be taken to give a limitation to the embodiment of the present invention.

The first threshold voltage $E_1$ is also connected to a positive input terminal of a first comparator 18. The output stage of the first capacitor $C_{14}$. Also, the second threshold voltage $E_2$ is linked to a negative input terminal of a second capacitor 20. A positive input terminal of the second comparator 20 is connected to the output stage of the second capacitor $C_{16}$.

It is so designed that the first comparator 18 and second comparator 20 cooperate to determine the output signal appearing on the output stage of each of the first and second capacitors $C_{14}$ and $C_{16}$ are within the range between the first threshold voltage $E_1$ and second threshold voltage $E_2$ within a predetermined duration of time following the entrance of an inversed voltage signal $V_s$ into the noise reduction circuit 12 in the manner as will later be described in detail.

The effect that can be produced by the above-mentioned arrangement of two comparators 18, 20 respectively linked to R-C integrating circuit 14, 16 to operate in conjunction with separate threshold voltages $E_1$, $E_2$, can be provided by a variety of circuit designs. Therefore, it is to be noted that the present invention should not be considered to be limited to the illustrated embodiment.

Connected to the output of each of the comparators 18 and 20 is a logic circuit 24 which includes a first AND gate 26 and a second AND gate 28. The logic circuit 24 has a first output terminal Go and a second output terminal NoGo. The first AND gate 26 has a first input terminal $G_1$, a second input terminal $G_2$ and a third input terminal $G_3$. The first input terminal $G_1$ is connected to the output terminal of the first comparator 18. Also, the output terminal of the second comparator 20 is connected to the second input terminal $G_2$ of the AND gate 26, whose third input terminal $G_3$ is connected to a timing circuit 22 through a first inverter 30.

The timing circuit 22 supplies the third input terminal $G_3$ of the AND gate 26 with timing signals T. The timing circuit 22 is designed so that the value of its signal T is "0" when it is within a predetermined time period of the application of an inversed voltage signal $V_s$ to the circuit 12, and "1" following the lapse of the predetermined period. Because of the interposition of the inventer 30, the first AND gate 26 always receives an inversed signal $\overline{T}$ when the timing circuit 22 inputs its timing signal T.

The first comparator 18 feeds the first input terminal $G_1$ of the first AND gate signals $A_1$. The value of the signals $A_1$ is either "1" to indicate that the first threshold voltage $E_1$ is higher than the voltage signal from the output stage of the first capacitor $C_{14}$ or "0" to show that the difference is reversed. Similarly, the second comparator 20 supplies the first AND gate 26 through its second input terminal $G_2$ with signals $A_2$. The signals $A_2$ have either a logic 1 value when the second threshold voltage $E_2$ is lower than the voltage from the output stage of the second capacitor $C_{16}$ or a logic 0 value when relation is to the contrary.

With the above arrangement, the output of the first AND gate, which appears on the output terminal Go of the logic circuit 24, is the logical product P of the three input signals $A_1$, $A_2$ and $\overline{T}$ through its input terminals $G_1$, $G_2$ and $G_3$. In this embodiment, the logical product $P(=A_1 \cdot A_2 \cdot \overline{T})$ is "1" to indicate that the voltage signal from each of the output stages of the first and second capacitors $C_{14}$ and $C_{16}$ falls within the range between the first threshold voltage $E_1$ and second threshold voltage $E_2$ within the predetermined time period.

When the logical product P is "0", at least one of the aforesaid parameters is the opposite.

The timing circuit 22 is directly linked to a first input terminal $g_1$ of the second AND gate 28, which has its second input terminal $g_2$ connected to the output terminal of the first AND gate 26 through a second inverter 32. The value of the timing signal T component that the second AND gate 28 receives through its second input terminal $g_2$ must always be the same as that through teh first input terminal $g_1$, due to the connection of the two inverters 30 and 32, providing both the input signals $A_1$ and $A_2$ each have a value "1". Thus, the output of the second AND gate 28 is the logical product Q of the timing signal T and the sum of the not of the output signal $A_1$ and the not of the output $A_2$ from the first and second comparators 18 and 20, respectively, expressed as $Q=(\overline{A}_1+\overline{A}_2)\cdot T$.

In other words, the output of the second AND gate, which is linked to the second output terminal NoGo of the logic circuit 24, determines that either of the voltage signals from the output stages of the first and second capacitors $C_{14}$ and $C_{16}$ is not within the threshold voltage range between $E_1$ and $E_2$ after the lapse of the predetermined time period. To illustrate, when the logical product Q is "1", it means that at least one of the capacitor output voltages is within the reference voltage range after the predetermined time period. When Q=0, the situation is to the contrary.

The same result that satisfies the above logical porduct $Q=(\overline{A}_1+\overline{A}_2)\cdot T$ can be provided by a variety of circuit designs in which each of the output of comparators 18 and 20 is connected to a two-input NOR gate whose output is connected t the one input of an two-input AND gate, with the timing circuit 22 being connected to the other input of the AND gate. The output of the AND gate achieves that logical product.

FIG. 5 is a schematic of a logic circuit $24_A$ developed as a modification of the logic circuit 24 of FIG. 4, in which like components are designated by like numerals. In this modification, the output of each of the paired comparators 18 and 20 is connected to a first and a second input terminals of an OR gate 34 whose output terminal is linked to a first input terminal of an AND gate 36. The timing circuit 22 has its output connected to a second input terminal of the AND gate 36. The AND gate 26 receives through its three input terminals signals $A_1$, $A_2$ and T from the paired comparators 18, 29 and the timing circuit 22, respectively, in the same manner as in the logic circuit 24 of FIG. 4. With this arrangement, it would be clear to those versed in the art that the output of the AND gate, which appears on one output terminal Go of the circuit $24_A$, is the logical product P of the signals $A_1$, $A_2$ and $\overline{T}$, which is expressed as $P=A_1 \cdot A_2 \cdot \overline{T}$. Similarly, the output of the other AND gate 36, which comes out from the output terminal NoGo, is the logical product Q of the timing signal T and the sum of the signals $A_1$ and $A_2$, expressed as $Q=(\overline{A}_1+\overline{A}_2)\cdot T$.

There can be other forms of circuit structures that provide the same effect as the illustrated embodiments. The present invention should be considered to cover all possible modifications conceivable bases on the embodiments in FIGS. 4 and 5.

Since the construction of the noise reduction circuit $12_A$ is described, the operation of the circuit will be explained in full detail according to the present invention in conjunction with FIGS. 4 and 5.

With respect to FIG. 4, in operation, before a signal voltage $V_s$ to be measured is passed into the noise reduction circuit 12, the pairedswitches $S_1$ and $S_2$ are simultaneously closed. As a result, the first capacitor $C_{14}$ is charged with a combined voltage ($E_1 30 E_3$) of first threshold voltage $E_1$ with negative intialzation voltage $E_4$. Also, the second capacitor $C_{16}$ is charged with a combined voltage ($E_2-E_4$) of positive second threshold voltage $E_2$ and negative intialization voltage $E_4$.

Upon the application of the signal voltage $V_s$, which is the superimposition of a signal voltage $E_s$ to be measured and a noise voltage $E_n$, to both the first R-C integrating circuit 14 (composed of $R_{14}$ and $C_{14}$) and second R-C integrating circuit 16 (composed of $R_{16}$ and $C_{16}$), the switch $S_1$ and $S_2$ are both opened simultaneously. In this process, the noise reduction circuit 12 achieves a reduction in the noise signal component $E_n$ in the voltage signal $V_s$ by integration.

Letting $V_s = 2/\pi E_s$, the voltage $V_1$ appearing on the output stage of the first capacitor 14 upon discharge is;

$$V_1 = (E_1 + E_3)e^{-t/\tau_1} + (1 - e^{-t/\tau_1})V_s \quad (11)$$

where $\tau_1 = R_{14} \cdot C_{14}$ (product of capacitor $C_{14}$ and resistor $R_{14}$ in the first R-C circuit 14,)

Likewise, the voltage $V_2$ appering on the output stage of the second capacitor $C_{16}$ upon discharge is:

$$V_2 = (E_2 - E_2)e^{-t/\tau_2} + (1 - e^{-t/\tau_2})V_s \quad (12)$$

where $\tau_2 = R_{16} \cdot C_{16}$ (product of capacitor $C_{16}$ and resistor $R_{16}$ in the second R-C circuit 16,)

When the voltage signal $V_s$ to be measured has fallen within the range between the first and second threshold voltages $E_1$ and $E_2$, as shown in FIG. 6(a), the discharged voltages $V_1$ and $V_2$ appearing on the output stages of the first capacitor $C_{14}$ and second capacitor 16 should necessarily reach their associated threshold voltages $E_1$ and $E_2$, respectively, within some time of the input of the that signal $V_s$. If this time is shorter than the predetermined time during which the timing circuit 22 is generating a logic 0 signal, the logical product P of the three signals $A_1$, $A_2$ and $\overline{T}$, which appears on the output terminal of the first AND gate 26, will be $P = A_1 \cdot A_2 \cdot \overline{T} = 1$. In this embodiment the logical product $P = 1$ means that the noise reduction circuit $12_A$ has achived the highest noise reduction in the superimposed voltage $V_s$. The output "1" may be connected through the output terminal Go of the circuit $12_A$ to a suitable recording device which takes track of voltage readings at this moment.

However, if the voltage signal $V_s$ to be measured has occured outside the threshold voltgage range between $E_1$ and $E_2$, say, above the first threshold voltage $E_1$, as shown in FIG. 6(a), it could never happen that the discharged voltage $V_1$ from the first capacitor $C_{14}$ reaches the first threshold voltage $E_1$.

In this case, the timing circuit 22 will eventually outrun the predetermined time period, and produce a logic 1 signal. As a result, the logical product Q, which appearing of the second AND gate 28, is $Q = (\overline{A}_1 + \overline{A}_2) \cdot T = 1$. The logical product $Q = 1$ means that the noise reduction circuit 12 is in wrong condition to achieve an acceptable noise reduction. This output is conveyed through the output terminal NoGo of the circuit $12_A$ to a suitable means which disconnects the circuit from the recording device.

Figure 1:
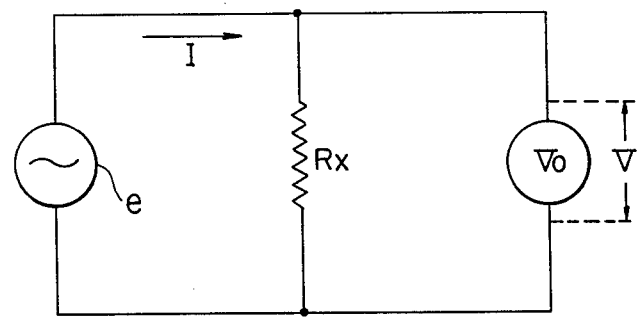
FIG. 1 is a schematic of a basic circuit for measuring resistances using a voltmeter.
Figure 2:
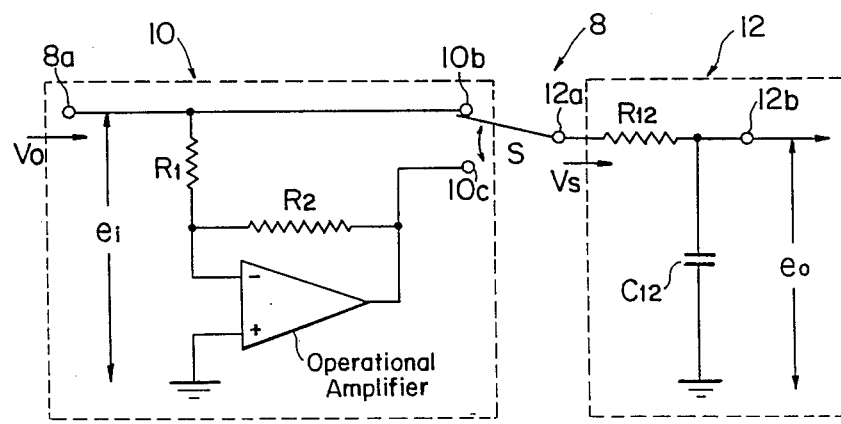
FIG. 2 is a schematic of a basic circuit designed for noise reduction in resistance measurements, comprising an operational amplifier for polarity inversion, a signal selector switch and an integrating circuit.
Figure 3A:
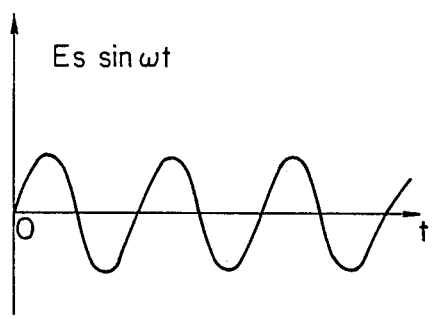
FIG. 3(a) is a voltage difference signal to be measured.
Figure 3B:
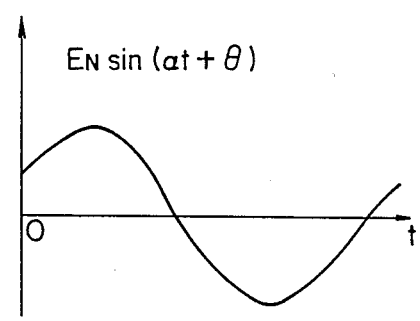
FIG. 3(b) is a noise signal developed by measuring instruments.
Figure 3C:
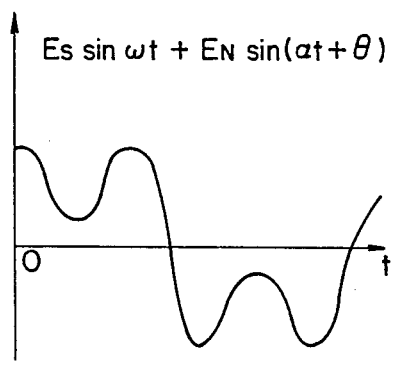
FIG. 3(c) is a diagram indicating the superimposition of the voltage signal of FIG. 3(a) and noise signal of FIG. 3(b)
Figure 3D:
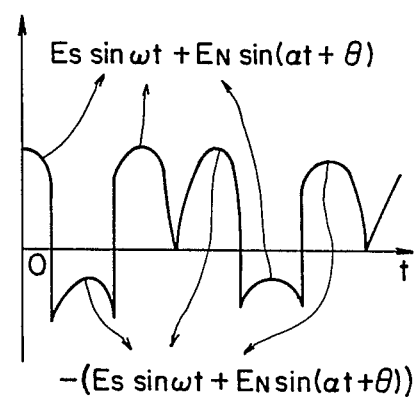
FIG. 3(d) is a diagram showing the result of superimposition of the non-inverted first half of each cycle of the splited superimposed signal of FIG. 3(c) and the second half that was inversed by a phase detection circuit.
Figure 3E:
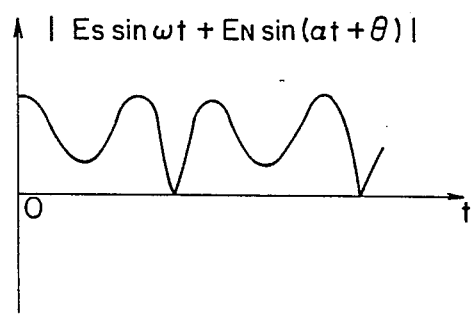
FIG. 3(e) is a diagram showing the rectification of the voltage signal shown in FIG. 3(c)

In the circuit shown in FIG. 2, the discharged voltage V from the capacitor $C_{12}$ of the R-C integrating circuit 12 is $V = E_s(1 - e^{-t/\tau})$. Letting $E_s$ be the voltage to be measured, if the value for V should be such that $V = (1 - \alpha)E_s$, the value for the aforesaid predetermind time period $T_o$ during which the timing circuit 22 generates a logic 0 signal is required to be such that $e^{-t/\tau} = \alpha$, where $\alpha$ is the allowable rate of error of the discharged capacitor voltage to the voltage signal $E_s$ to be measured. The value for $\alpha$ should therefore be 1% when the discharged voltage is set to come 99% of the voltage signal $E_s$. Generally, $1 \gg \alpha > 0$. It thus follows that the value for $T_o$ is:

$$T_o = \tau/\log(1 - \alpha) \quad (13)$$

Using this basic concept for the noise reduction circuit $12_A$ of FIG. 4 according to the present invention, the time in which the voltage $V_1$ on the output of the capacitor $C_{14}$ reaches the first threshold voltage $E_1$ must satisfy the following equation:

$$(E_1 + E_3)e^{-t/\tau_1} + (1 - e^{-t/\tau_1})V_s = E_1 \quad (14)$$

The difference $\alpha E_s$ between the voltage signal $E_s$ to be measured and the first threshold voltage $E_1$ is:

$$E_1 - V_s = \alpha V_s \quad (15)$$

It thus follows that, letting $T_1$ the time in which the discharged voltage $V_1$ from the first capacitor $C_{14}$ reaches the first threshold voltage $E_1$, the value for $T_1$ using the equations 14 and 15 above, must satisfy the following equation:

$$T_1 = \tau_1 \log\{1 + (1 + /\alpha)E_3/E_1\} \quad (16)$$

Similarly, the time in which the voltage $V_2$ appearing on the output stage of the second capacitor $C_{16}$ reaches the second threshold voltage $E_2$ must meet the equation as follows:

$$(E_2 - E_4)e^{-t/\tau_2}(1 - e^{-t/\tau_2})V_s = E_2 \quad (17)$$

The difference $\alpha V_s$ between the signal $V_s$ to be measured and the first threshold voltage $E_2$ is:

$$V_s - E_2 = \alpha V_s \quad (18)$$

Likewise, it follows that, letting $T_2$ the time in which the discharge $V_2$ from the output stage of the second capasitor $C_{16}$ reaches the second threshold voltage $E_2$, the value for $T_2$, using the equations 17 and 18 above, must satisfy the equation as follows:

$$T_2 = \tau_2 \log\{1 + (1/\alpha - 1)E_4/E_2\} \quad (19)$$

The time period $T_o$, as solved by the equation 13 above, in which the voltage discharged from the capasitor $C_{12}$ of the circuit 8 in FIG. 2 will be compared with $T_1$ and $T_s$ obtained by the equations 16 and 19.

Since $E_1 > E_3$, it follows that $1/\alpha > 1 > 1 + (1 + 1/\alpha)E_3/E_1$. Furthermore, since $E_2 > E_4$, then obviously $1/\alpha > 1 > 1 + (1/\alpha - 1)E_4/E_2$.

Accordingly, $T_o \gg T_1$ and $T_o \gg T_2$.

It will be clear from the above that discharge of the capacitors $C_{14}$ and $C_{16}$ precharged with pairs of initialization voltages $E_3$ and $E_4$ and threshold voltages $E_1$ and $E_2$, upon the input of an inverted voltage signal $V_s$ to be measure, would allow the discharged voltage signals to come close to the value for $V_s(= 2/\pi E_s)$, providing the signal $V_s$ is within the range between $E_1$ and $E_2$, in a far shorter time in the noise reduction circuit $12_A$ of this invention (FIG. 4) than in the prior art devices such as the one in FIG. 2.

It will be appreciated from the above that the noise recution circuit according to the present invention can be effectively used in measurement of resistance of infinitesimal magnitudes, in which conventional R-C intengating circuits, while achieving a reduction in the noise component of the input signal comprised of the noise superimposed onto a signal to be measured, producing a capacitor discharged voltage at levels approaching the voltage signal to be measured.

What is claimed is:

1. In an ohmmeter which includes a phase detection means to split each cycle of a voltage signal to be measured into a first and second series of half waves, an inverter means to inverse the second series of half waves, an integrating R-C circuit means to combine the first and second series of half waves in such a manner as to achieved a reduction in the noise component of the superimposition of noise and a signal to be measured, the improvement comprising:

the integrating R-C circuit means comprising a pair of first R-C integrating circuit and second R-C integrating circuit connected in parallel:

a first switch means $S_1$ adapted to charge a first capacitor in the first R-C integrating circuit with a first combined voltage $E_1+E_3$ of a first positive threshold voltage $E_1$ with positive initial set up voltage $E_3$;

a second switch means $S_2$ adapted to charge a second capacitor in the second R-C integrating circuit with a second combined voltage $E_2-E_4$ of a second positive threshold voltage $E_2$ with negative initial set up voltage $-E_4$, the first threshold voltage $E_1$ and second threshold voltage $E_2$ being set to differ in magnitude from each other so as to define a threshold voltage range, the first switch means $S_1$ and second switch means $S_2$ being actuated to close a supply circuit which in turn supplies both the first combined voltage $E_1+E_3$ to the first capacitor, and the second combined voltage $E_2-E_4$ to the second capacitor, respectively, a predetermined time before the entrance of a voltage signal to be measured, the first and second switch means being opened to break the supply circuit upon the input of the voltage signal to be measured;

a first comparator connected to the first R-C integrating circuit and adapted to compare the first threshold voltage and a first output voltage discharged from the first capacitor;

a second comparator connected to the second R-C integrating circuit and adapted to compare the second threshold voltage and a second output voltage discharged from the second capacitor;

a logic circuit connected to the first and second comparators and a timing circuit, the timing circuit adapted to supply timing signals to the logic circuit, the logic circuit adapted to determine whether the first and second discharged voltages are within the range of their associated threshold voltages $E_1$ and $E_2$ in a set time following the input of the voltage signal to be measured in conjunction with the timing signal from the timing circuit.

2. A device as set forth in claim 1, wherein the first comparator outputs a first logic signal $A_1$ whose value is 0 when the discharged voltage output from the first capacitor is higher than the first threshold voltage $E_1$, the value for the first logic signal being 1 when the discharged voltage from the first capacitor is lower than the first threshold voltage, the second comparator outputs a second logic signal $A_2$ whose value is 1 when the discharged voltage output from the second capacitor is higher than tha second logic threshold voltage $E_2$, the value for the second logic signal being 0 when the discharged voltage from the second capacitor is lower than the second threshold voltage $E_2$, and the timing circuit outputs a logic timing signal T whose value is 0 before a set time period lapses, the value of the timing logic signal being 1 after the lapse of the set time period, wherein the logic circuit comprises a first circuit part which computes the logical product P of the first logic signal $A_1$, the second logic signal $A_2$ and the not of the logic timing signal T, and a second circuit part which computes the logical product Q of the logic timing signal T and the sum of the not of the first logic signal $A_1$ and not of the second logic signal $A_2$, the logic circuit being linked to a first output terminal which, when the logical product P computed by the first circuit part is 1, outputs a first signal indicating the right time for resistance measurements, the logic circuit being linked to a second output terminal which, when the logical product Q by the second circuit part is 1, outputs a second signal indicating the wrong time for resistance measurements.

* * * * *